(12) United States Patent
Chen et al.

(10) Patent No.: US 9,263,882 B2
(45) Date of Patent: Feb. 16, 2016

(54) OUTPUT CIRCUITS WITH ELECTROSTATIC DISCHARGE PROTECTION

(71) Applicant: MediaTek Inc., Hsin-Chu (TW)

(72) Inventors: Chun-Chi Chen, New Taipei (TW); Sheng-Fu Hsu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 91 days.

(21) Appl. No.: 13/792,951

(22) Filed: Mar. 11, 2013

(65) Prior Publication Data

US 2013/0293993 A1   Nov. 7, 2013

Related U.S. Application Data

(60) Provisional application No. 61/642,188, filed on May 3, 2012.

(51) Int. Cl.
| | |
|---|---|
| *H02H 9/04* | (2006.01) |
| *H03K 19/0185* | (2006.01) |
| *H01L 27/02* | (2006.01) |
| *H03K 19/003* | (2006.01) |

(52) U.S. Cl.
CPC ........... *H02H 9/046* (2013.01); *H01L 27/0285* (2013.01); *H03K 19/00315* (2013.01); *H03K 19/0185* (2013.01); *H03K 19/018521* (2013.01)

(58) Field of Classification Search
CPC .............. H02H 9/046; H03K 16/0185; H03K 16/018521; H03K 16/00315; H01L 27/0285
USPC .......................................................... 361/56
See application file for complete search history.

(56) References Cited

U.S. PATENT DOCUMENTS

| | | | |
|---|---|---|---|
| 5,400,202 A | 3/1995 | Metz et al. | |
| 7,102,862 B1 * | 9/2006 | Lien et al. | ........................ 361/56 |
| 7,692,905 B2 * | 4/2010 | Hung | ............................... 361/56 |
| 2007/0091524 A1 | 4/2007 | Davis | |
| 2008/0278872 A1 | 11/2008 | Wang et al. | |

FOREIGN PATENT DOCUMENTS

| | | |
|---|---|---|
| CN | 1447427 A | 10/2003 |
| CN | 1953178 A | 4/2007 |
| CN | 101039027 A | 9/2007 |
| CN | 101488665 A | 7/2009 |
| EP | 0533336 A1 | 3/1993 |

\* cited by examiner

*Primary Examiner* — Thienvu Tran
*Assistant Examiner* — Kevin J Comber
(74) *Attorney, Agent, or Firm* — McClure, Qualey & Rodack, LLP

(57) ABSTRACT

An output circuit is provided and includes first and second output stage elements, a detection circuit, a control circuit, and a first pre-driver. The first and second output stage elements are coupled in series between a power terminal and the ground terminal. The detection circuit detect whether an electrostatic discharge event occurs at an output terminal between the two output stage elements to generate a control signal. The control circuit controls a state of the first output stage element when the control circuit is enabled according to the control signal. The first pre-driver controls the state of the first output stage element when the first per-driver is enabled according to the control signal. When the detection circuit detects that the electrostatic discharge event occurs at the output terminal, the control circuit is enabled to turn on the first output stage element, and the first pre-driver is disabled.

16 Claims, 2 Drawing Sheets

OUTPUT CIRCUITS WITH ELECTROSTATIC DISCHARGE PROTECTION

CROSS REFERENCE TO RELATED APPLICATIONS

This application claims the benefit of U.S. Provisional Application No. 61/642,188, filed on May 3, 2012, the contents of which are incorporated herein by reference.

BACKGROUND OF THE INVENTION

1. Field of the Invention

The invention relates to an output circuit, and more particularly to an output circuit with electrostatic discharge protection.

2. Description of the Related Art

Electrostatic discharge (ESD) damage has become one of the main reliability concerns facing integrated circuit (IC) products. Generally, an output circuit of a power stage in an IC comprises a PMOS transistor and an NMOS transistor which are coupled to an output terminal of the power stage. During a manufacture process or a product test process, when an ESD event occurs at the output terminal, a large current may damage elements of the power stage. Thus, an ESD prevention circuit is required to provide a discharging path when an ESD event occurs at the output terminal. In prior arts, an ESD prevention circuit is coupled to an output terminal of a power stage in an IC for providing ESD prevention when an ESD even occurs at the output terminal. However, the ESD prevention circuit occupies a large area in the IC. Moreover, when the ESD prevention circuit is desired to have high reliable, the design of the ESD prevention circuit becomes difficult.

BRIEF SUMMARY OF THE INVENTION

An exemplary embodiment of an output circuit is provided. The output circuit comprises a first output stage element, a second output stage element, a detection circuit, a control circuit, and a first pre-driver. The first output stage element is coupled to an output terminal of the output circuit and a ground terminal. The second output stage element is coupled to the output terminal and a power terminal. The detection circuit is coupled to the power terminal. The detection circuit performs a detection operation to detect whether an electrostatic discharge event occurs at the output terminal to generate a control signal at a first node. The control circuit is coupled to the first node. The control circuit receives the control signal and controls a state of the first output stage element when the control circuit is enabled according to the control signal. The first pre-driver receives the control signal and controls the state of the first output stage element when the first per-driver is enabled according to the control signal. When the detection circuit detects that the electrostatic discharge event occurs at the output terminal, the control circuit is enabled according to the control signal to turn on the first output stage element to form a discharge path, and the first pre-driver is disabled according to the control signal.

An exemplary embodiment of an output circuit is provided. The output circuit comprises a first N-type transistor, a first P-type transistor, a resistor, a capacitor, a second P-type transistor, and a first pre-driver. The first N-type transistor has a gate, a drain coupled to an output terminal, and a source coupled to a ground terminal. The first P-type transistor has a gate, a drain coupled to the output terminal of the output circuit, and a source coupled to a power terminal. The resistor is coupled between the power terminal and a first node. The capacitor is coupled to the first node and the ground terminal. A control signal is generated at the first node. The second P-type transistor has a gate coupled to the first node, a source coupled to the power terminal, and a drain coupled to the gate of the first N-type transistor at a second node. The first pre-driver is coupled between the first node and the second node. The first pre-driver controls a state of the first N-type transistor when the pre-driver is enabled according to the control signal. When an electrostatic discharge event occurs at the output terminal, a voltage at the power terminal is pulled high, the control signal is at a first low level to turn on the second P-type transistor, and a voltage at the second node is at a first high level according to the pulled high voltage at the power terminal to turn on the first N-type transistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
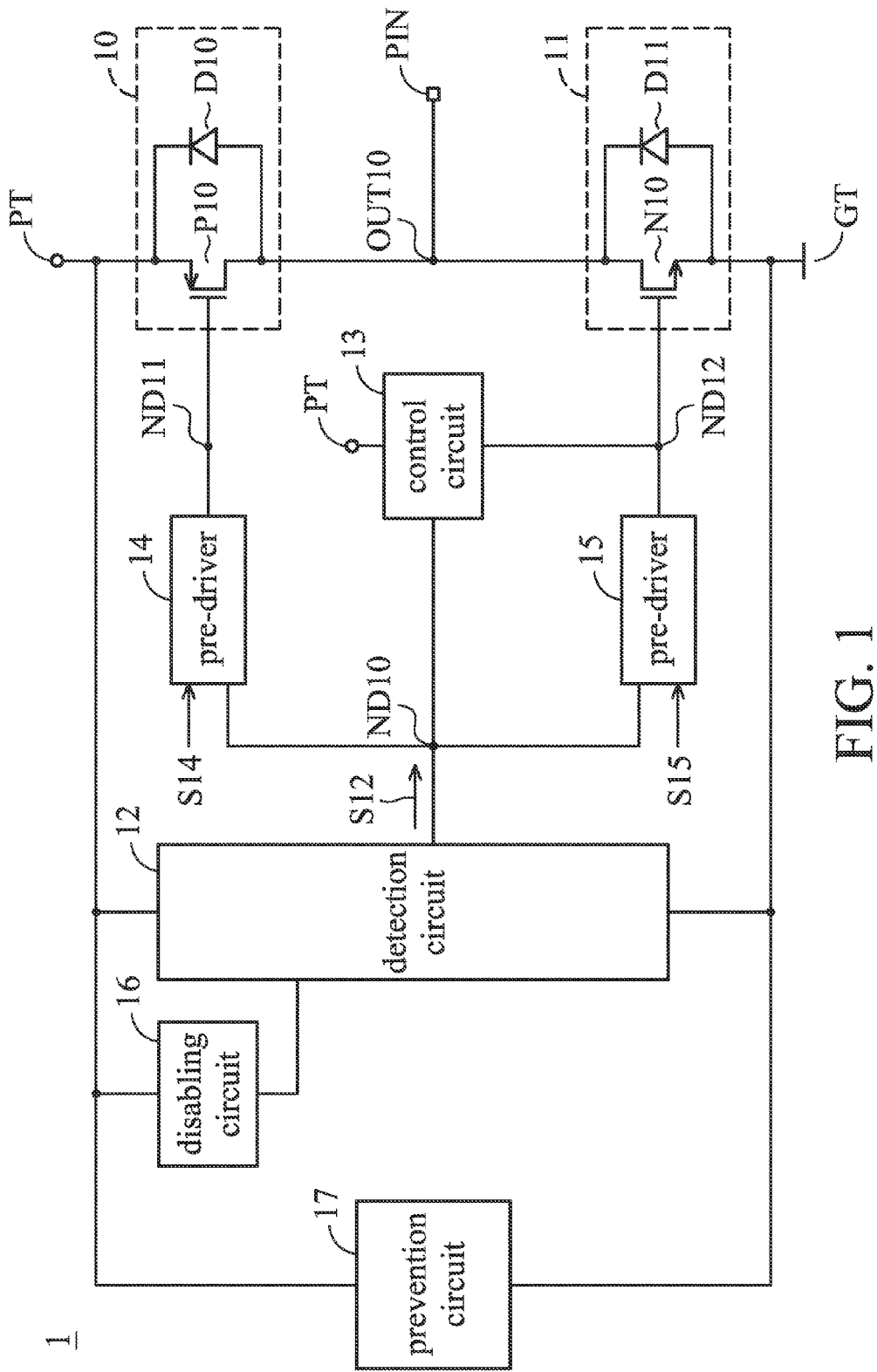
FIG. 1 shows one exemplary embodiment of an output circuit.

Output circuits are provided. In an exemplary embodiment of an output circuits in FIG. 1, an output circuit 1 (or driver circuit) comprises two output-stage elements 10 and 11, a detection circuit 12, a control circuit 13, two pre-drivers 14 and 15, a disabling circuit 16, and a prevention circuit 17. The output circuit 1 may be applied in a power stage of an integrated circuit. An output terminal OUT10 of the output circuit 1 is coupled to a pin PIN of the IC. In the embodiment, the output-stage element 10 is implemented by, but not limited to a P-type metal-oxide-semiconductor (PMOS) transistor P10, while the output-stage element 11 is implemented by, but not limited to an N-type metal-oxide-semiconductor (NMOS) transistor N10. A source of the PMOS transistor P10 is coupled to a power terminal PT, and a drain thereof is coupled to the output terminal OUT10. A drain of the NMOS transistor N10 is coupled to the output terminal OUT10, and a source thereof is coupled to a ground terminal GT. In FIG. 1, a diode D10 coupled in parallel with the PMOS transistor P10 represents a parasitic diode of the PMOS transistor P10 or a substantial diode, while a diode D11 coupled in parallel with the NMOS transistor N10 represents a parasitic diode of the NMOS transistor N10 or a substantial diode. The detection circuit 12 is coupled to the power terminal PT. The detection circuit 12 performs a detection operation to detect whether an electrostatic discharge event occurs at the output terminal OUT10 to generate a control signal S12 at a node ND10. The control circuit 13 is coupled to the node ND10 to receive the control signal S12. When the control circuit 13 is enabled according to the control signal S12, the control circuit 13 controls a turned-on/off state of the NMOS N-type transistor N10. Therefore, when the ESD event is auto-detected by the detection circuit 12, the control signal S12 is issued to form a discharge path for ESD energy through controlling the control circuit 13 and the output-stage element 11 (e.g. the NMOS transistor N10). With this scheme, the integrated circuit can be protected with reduced layout size while an additional and dedicated ESD prevention circuit mentioned in the related art may be eliminated.

The pre-drivers 14 and 15 are coupled to gates of the PMOS transistor P10 and the NMOS transistor N10 at nodes ND11 and ND12, respectively. Both of the pre-drivers 14 and 15 are coupled to the node ND10 to receive the control signal S12. When the pre-driver 14 is enabled according to the control signal S12, the pre-driver 14 controls a turned-on/off state of the PMOS P10 according to a data signal S14 provided to the pre-driver 14. When the pre-driver 15 is enabled according to the control signal S12, the pre-driver 15 controls the turned-on/off state of the NMOS N10 according to a data signal S15 provided to the pre-driver 15.

The detailed structures of the detection circuit 12 and the control circuit 13 and the detailed operation of the output circuit 1 will be described in following by referring to FIG. 2.

Figure 2:
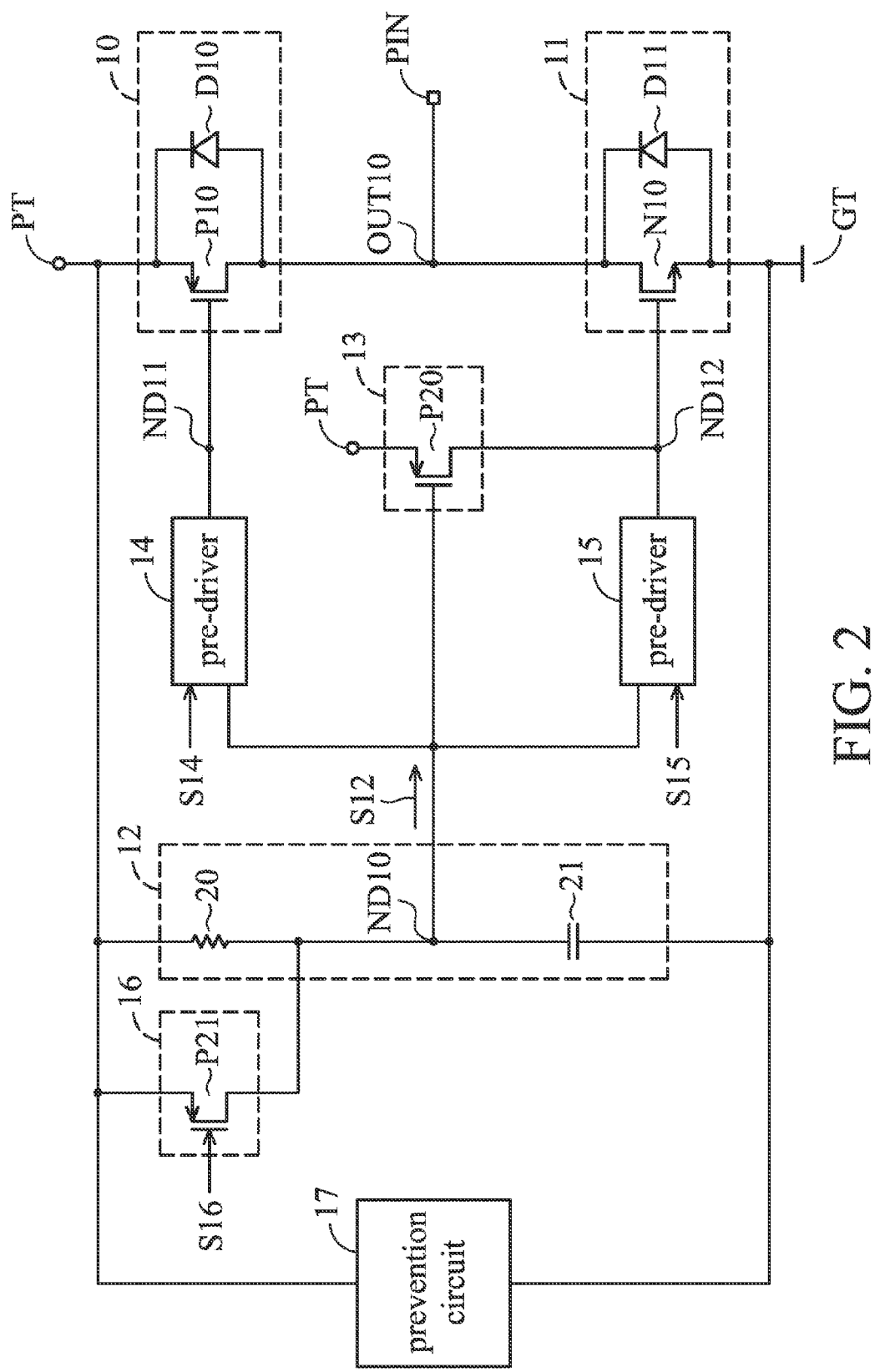
FIG. 2 shows another exemplary embodiment of an output circuit.

As shown in FIG. 2, the detection circuit 12 comprises a resistor 20 and a capacitor 21. The resistor 20 is coupled between the power terminal PT and the node ND10, while the capacitor 21 is coupled between the node ND10 and the ground terminal GT. The resistor 20 and the capacitor 21 form a low pass filter. Note that a skilled person should appreciate the detection circuit 12 may have other configurations, as long as a similar effect is achieved. The control circuit 13 comprises a PMOS transistor P20 but not limited thereto. A gate (control terminal) of the PMOS transistor P20 is coupled to the node ND10 to receive the control signal S12, a source (first terminal) thereof is coupled to the power terminal, and a drain (second terminal) thereof is coupled to the gate of the NMOS transistor N10 at the node ND12.

In the embodiment, the output circuit 1 may suffer a specific process, such as a manufacture process or a product test process of the power stage. During the specific process, the power terminal PT is not applied by an operation voltage of the output circuit 1. In this situation, when an ESD event occurs at the output terminal OUT10 (e.g. ESD energy surges into the integrated circuit), the diode D10 is turned on due to a large voltage at the output terminal OUT10, and then a voltage at the power terminal PT is immediately pulled high by the high voltage at the output terminal OUT10 through the turned on diode D10. The detection circuit 12 detects that there is an ESD event occurring at the output terminal OUT10 according to the immediately variation of the voltage at the power terminal PT. Through the low pass filter formed by the resistor 20 and the capacitor 21, the detection circuit 12 generates the control signal S12 with a low voltage level at the node ND10, wherein the low voltage level of the control signal S12 is lower than the pulled high voltage level of the power terminal PT. At this time, the gate of the PMOS transistor P20 is at the low voltage level of the control signal S12, while the source of the PMOS transistor P20 is at the pulled high voltage level of the power terminal PT. Thus, the PMOS transistor P20 is turned on, that is, the control circuit 13 is enabled. A voltage at the node ND12 is at a high level according to the pulled high voltage level of the power terminal PT through the turned-on PMOS transistor P20. In other words, the gate of the NMOS transistor N10 is at the pulled high voltage level, and the NMOS transistor is thus turned on. Accordingly, a discharging path is formed between the output terminal OUT10 and the ground terminal GT through the turned-on NMOS transistor N10. A large current induced by the ESD event at the output terminal OUT10 is discharged through the discharging path.

Moreover, both of the pre-drivers 14 and 15 are coupled to the node ND10 to receive the control signal S12 with the low voltage level. Both of the pre-drivers 14 and 15 are disabled according to the control signal S12 with the low voltage level. Thus, the disabled pre-driver 14 does not control the turned-on/off state of the PMOS transistor P10. The disabled pre-driver 15 does not control the turned-on/off state of the NMOS transistor N10, that is, the disabled pre-driver 15 does not vary the voltage at the node ND12.

According the above description, when an ESD event occurs at the output terminal OUT10, the detection circuit 12 and the control circuit 13 controls the NMOS transistor N10 to be turned on, such that the large current at the output terminal OUT10 can be discharged through the turned-on NMOS transistor N10, thereby protecting elements of the power stage from damage. Generally, the NMOS transistor N10 has a large size, thus, it can sustain surge of large currents.

When the power stage normally operates, the power terminal PT of the output circuit 1 receives an operation voltage of the output circuit 1. The detection circuit 12 generates the control signal S12 with a high voltage level according to the operation voltage. At this time, the gate of the PMOS transistor P20 is at the high voltage level of the control signal S12, while the source of the PMOS transistor P20 receives the operation voltage of the power terminal PT. Due to the high voltage levels at the gate and the source of the PMOS transistor P20, the PMOS transistor P20 is turned off. In other words, the control circuit 13 is disabled and does not control the turned-on/off state of the NMOS transistor N10. Moreover, both of the pre-drivers 14 and 15 are coupled to the node ND10 to receive the control signal S12 with the high voltage level. Both of the pre-drivers 14 and 15 are enabled according to the control signal S12 with the high voltage level. The enabled pre-driver 14 further receives a data signal S14 and varies the voltage at the node ND11 according to the data signal S14 thereby controlling the turned-on/off state of the PMOS transistor P10. The enabled pre-driver 15 further receives a data signal S14 and varies the voltage at the node ND12 according to the data signal S15 thereby controlling the turned-on/off state of the NMOS transistor N10.

In the embodiment, the disabling circuit 16 is used to disable the ESD detection operation of the detection circuit 12 when the power terminal PT receives the operation voltage for ensuring that the control signal S12 is at the high voltage level. Referring to FIG. 2, the disabling circuit 16 comprises a PMOS transistor P21 but not limited thereto. A gate (control terminal) of the PMOS transistor P21 receives a reset signal S16, a source (first terminal) thereof is coupled to the power terminal, and a drain (second terminal) thereof is coupled to the node ND10. When the power terminal PT receives the operation voltage, the reset signal S16 is at a low voltage level to turn on the PMOS transistor P21, that is, the turned-on PMOS transistor P21 shorts the two terminals of the resistor 20 of the detection circuit 12. Thus, the control signal S12 is at the high voltage level according to the operation voltage through the turned-on PMOS transistor.

When the output circuit 1 suffers the above specific process where an ESD event may occur, the reset signal S16 is at a high voltage level to turn off the PMOS transistor P21, such that the detection circuit 12 can perform the ESD detection operation as described above.

Further referring to FIG. 2, the prevention circuit 17 is coupled between the power terminal PT and the ground terminal GT. When the power terminal PT receives the operation voltage, the prevention circuit 17 provides a discharging path for ESD events occurring at the power terminal PT.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An output circuit comprising:
    a first output stage element coupled to an output terminal of the output circuit and a ground terminal;
    a second output stage element coupled to the output terminal and a power terminal;
    a detection circuit, coupled to the power terminal, for performing a detection operation to detect whether an electrostatic discharge event occurs at the output terminal to generate a control signal (S12) at a first node, wherein the detection circuit comprises:
    a resistor coupled between the power terminal and the first node; and
    a capacitor coupled to the first node and the ground terminal, wherein the control signal is generated at the first node;
    a control circuit, directly connected to the first node, for receiving the control signal and controlling a state of the first output stage element when the control circuit is enabled according to the control signal; and
    a first pre-driver for receiving the control signal and controlling the state of the first output stage element when the first pre-driver is enabled according to the control signal,
    wherein when the detection circuit detects that the electrostatic discharge event occurs at the output terminal, the control circuit is enabled according to the control signal to turn on the first output stage element to form a discharge path, and the first pre-driver is disabled according to the control signal.

2. The output circuit as claimed in claim 1, wherein the control circuit comprises:
    a transistor having a control terminal coupled to the first node to receive the control signal, a first terminal coupled to the power terminal, and a second terminal coupled to the first output stage element at a second node.

3. The output circuit as claimed in claim 2, wherein when the electrostatic discharge event occurs at the output terminal, the detection circuit generates the control signal according to a voltage at the power terminal to enable the control circuit by turning on the transistor, and a voltage at the second node is at a first level according to the voltage at the power terminal to turn on the first output stage element.

4. The output circuit as claimed in claim 2, wherein the first pre-driver further receives a data signal, and
    wherein when the power terminal receives an operation voltage of the output circuit, the detection circuit generates the control signal according to the operation voltage at the power terminal to disable the control circuit by turning off the first transistor and further enable the first pre-driver, and the enabled first pre-driver varies the voltage at the second node according to the data signal to control the state of the first output stage element.

5. The output circuit as claimed in claim 1, wherein the detection circuit comprises a low pass filter coupled between the power terminal and the ground terminal.

6. The output circuit as claimed in claim 5, wherein the low pass filter comprises:
    a resistor coupled between the power terminal and the first node; and
    a capacitor coupled to the first node and the ground terminal,
    wherein the detection circuit generates the control signal at the first node.

7. The output circuit as claimed in claim 1, wherein when the electrostatic discharge event occurs at the output terminal, a voltage at the power terminal is pulled high, the detection circuit generates the control signal according to the pulled high voltage at the power terminal to enable the control circuit, and the enabled control circuit controls a voltage at the second node to be a high level to turn on the first output stage element.

8. The output circuit as claimed in claim 1, wherein the first pre-driver further receives a data signal, and
    wherein when the power terminal receives an operation voltage of the output circuit, the detection circuit generates the control signal according to the operation voltage at the power terminal to disable the control circuit and further enable the first pre-driver, and the enabled first pre-driver controls the state of the first output stage element according to the data signal.

9. The output circuit as claimed in claim 1 further comprising:
    a second pre-driver for receiving the control signal and controlling a state of the second output stage element when the second pre-driver is enabled according to the control signal,
    wherein when the detection circuit detects that the electrostatic discharge event occurs at the output terminal, the second pre-driver is disabled according to the control signal.

10. The output circuit as claimed in claim 9, wherein the second pre-driver further receives a data signal, and
    wherein when the power terminal receives an operation voltage of the output circuit, the detection circuit generates the control signal according to the operation voltage at the power terminal to enable the second pre-driver, and the enabled second pre-driver controls the state of the second output stage element according to the data signal.

11. The output circuit as claimed in claim 1 further comprising:
    a disabling circuit coupled to the power terminal and the detection circuit,
    wherein when the power terminal receives an operation voltage of the output circuit, the disabling circuit disables the detection operation of the detection circuit and generates the control signal according to the operation voltage to disable the control circuit and further enable the first pre-driver.

12. The output circuit as claimed in claim 11, wherein the disabling circuit comprises:
    a transistor having a control terminal receiving a reset signal, a first terminal coupled to the power terminal, and a second terminal coupled to the first node,
    wherein when the power terminal receives the operation voltage, the transistor is turned on.

13. An output circuit comprising:
- a first N-type transistor having a gate, a drain coupled to an output terminal, and a source coupled to a ground terminal;
- a first P-type transistor having a gate, a drain coupled to the output terminal of the output circuit, and a source coupled to a power terminal;
- a resistor coupled between the power terminal and a first node;
- a capacitor coupled to the first node and the ground terminal, wherein a control signal is generated at the first node;
- a second P-type transistor having a gate directly connected to the first node, a source coupled to the power terminal, and a drain coupled to the gate of the first N-type transistor at a second node; and
- a first pre-driver, coupled between the first node and the second node, for controlling a state of the first N-type transistor when the pre-driver is enabled according to the control signal,
- wherein when an electrostatic discharge event occurs at the output terminal, a voltage at the power terminal is pulled high, the control signal is at a first low level to turn on the second P-type transistor, and a voltage at the second node is at a first high level according to the pulled high voltage at the power terminal to turn on the first N-type transistor.

14. The output circuit as claimed in claim 13, wherein the first pre-driver further receives a first data signal, and
- wherein when the power terminal receives an operation voltage of the output circuit, the control signal is at a second high level to turn off the second P-type transistor and further enable the first pre-driver, and the enabled first pre-driver varies the voltage at the second node according to the first data signal to control the state of the first N-type transistor.

15. The output circuit as claimed in claim 14 further comprising:
- a second pre-driver, coupled to the first node and further to the gate of the first P-type transistor at a third node, for receiving a second data signal and controlling a state of the first P-type transistor when the second pre-driver is enabled according to the control signal,
- wherein when the electrostatic discharge event occurs at the output terminal, the second pre-driver is disabled according to the control signal with the first low level, and
- wherein when the power terminal receives the operation voltage, the second pre-driver is enabled according to the control signal with the second high level, and the enabled second pre-driver varies a voltage at the third node according to the second data signal to control the state of the first P-type transistor.

16. The output circuit as claimed in claim 13 further comprising:
- a third P-type transistor coupled to the power terminal and the first node,
- wherein when the power terminal receives an operation voltage of the driving voltage, the third P-type transistor is turned on, the control signal is at a second high level to turn off the second P-type transistor and further enable the first pre-driver.

* * * * *